United States Patent
Mori et al.

(10) Patent No.: US 7,309,396 B2
(45) Date of Patent: Dec. 18, 2007

(54) GIANT MAGNETOSTRICTIVE MATERIAL AND HEAT TREATMENT METHOD FOR GIANT MAGNETOSTRICTIVE MATERIAL

(75) Inventors: Teruo Mori, Tokyo (JP); Shiro Tomizawa, Tokyo (JP)

(73) Assignee: TDK Corporation, Tokyo (JP)

(*) Notice: Subject to any disclaimer, the term of this patent is extended or adjusted under 35 U.S.C. 154(b) by 186 days.

(21) Appl. No.: 10/360,753

(22) Filed: Feb. 10, 2003

(65) Prior Publication Data

US 2003/0217786 A1    Nov. 27, 2003

(30) Foreign Application Priority Data

May 16, 2002    (JP)    ............... 2002-142197
Dec. 27, 2002    (JP)    ............... 2002-381918

(51) Int. Cl.
*H01F 1/055*    (2006.01)

(52) U.S. Cl. ........................ 148/301; 148/121

(58) Field of Classification Search ............... None
See application file for complete search history.

(56) References Cited

U.S. PATENT DOCUMENTS

| | | | |
|---|---|---|---|
| 4,849,034 A | | 7/1989 | Verhoeven et al. |
| 5,336,337 A | * | 8/1994 | Funayama et al. ........... 148/301 |
| 5,907,105 A | * | 5/1999 | Pinkerton et al. ....... 73/862.336 |
| 6,312,530 B1 | * | 11/2001 | Kojima et al. .............. 148/301 |
| 6,451,131 B1 | * | 9/2002 | Tai et al. .................... 148/301 |

FOREIGN PATENT DOCUMENTS

JP    1-176024    *    7/1989

* cited by examiner

*Primary Examiner*—John P. Sheehan
(74) *Attorney, Agent, or Firm*—Oblon, Spivak, McClelland, Maier & Neustadt, P.C.

(57) ABSTRACT

Restoring magnetostriction characteristics without causing fusion of rod. By performing heat treatment on a giant magnetostrictive material within the temperature range of 750 to 860° C., working distortion is removed while bleeding of an R-rich phase on a rod surface is prevented.

18 Claims, 8 Drawing Sheets

ABOVE EUTECTIC POINT

BELOW EUTECTIC POINT

| AGING TEMPERATURE | Dt | $\lambda_{0.4}$ AVERAGE | $\lambda_{0.4\sigma}$ | $\lambda_1$ AVERAGE | $\lambda_{1\sigma}$ | FUSION RATIO |
|---|---|---|---|---|---|---|
| 20 | 96.1 | 550 | 34 | 1100 | 66 | |
| 750 | 96.04 | 605 | 25 | 1170 | 49 | 0 |
| 820 | 96.12 | 610 | 21 | 1180 | 43 | 0 |
| 860 | 96.11 | 605 | 27 | 1170 | 55 | 10 |
| 875 | 96.09 | 590 | 31 | 1160 | 61 | 30 |
| 890 | 96.1 | 580 | 32 | 1160 | 64 | 40 |
| 950 | 96.11 | 570 | 37 | 1150 | 71 | 60 |
| 1150 | 96.09 | 530 | 39 | 1130 | 77 | 90 |
| 1230 | 96.44 | 490 | 45 | 1100 | 83 | 100 |

GIANT MAGNETOSTRICTIVE MATERIAL AND HEAT TREATMENT METHOD FOR GIANT MAGNETOSTRICTIVE MATERIAL

BACKGROUND OF THE INVENTION

The present invention relates to a giant magnetostrictive material and a heat treatment method for the giant magnetostrictive material and in particular to giant magnetostrictive material and a heat treatment method for the giant magnetostrictive material preferably applied to removal of working distortion of a giant magnetostrictive material and restoration of magnetostriction characteristics.

In recent years, a giant magnetostrictive material whose saturation magnetostriction is over 100 times that of traditional magnetic materials such as nickel and ferrite has been drawing attention in applications including actuators and sensors.

Among the $RFe_2$ Laves intermetallic compounds as representative giant magnetostrictive materials (R is at least one kind of rare-earth element) $TbFe_2$ has high magnetostriction when external magnetic field strength is high while it has lower magnetostriction when external magnetic field strength is low.

Thus, $(Tb, Dy)Fe_2$ obtained by replacing part of Tb with Dy is in general use as a giant magnetostrictive material with higher magnetostriction in a low magnetic field strength.

In particular, a giant magnetostrictive material having a composition of $Tb_{0.30}Dy_{0.70}Fe_{2.0}$ has a minimum crystal magnetic anisotropy at ordinary temperatures and large magnetostriction, and is greatly applicable and in widespread use.

The U.S. Patent Publication No. 4,849,034 discloses a method for improving the magnetostriction characteristics by applying heat treatment to RFex alloys such as $Tb_{0.30}Dy_{0.70}Fe_{2.0}$ within a temperature range of 870° C. to 1100° C.

Heat treatment for removal of magnetostriction is performed within this temperature range because a fused phase releases a stress.

However, performing heat treatment on an RFex alloy at a temperature of 870° C. or above enhances fusing of an R-rich layer of the RFex alloy on a rod surface. Heat treatment on an a stack of a large number of RFex alloys in rod shape causes fusion of rods. Separation of rods is accompanied by mechanical distortion thus degrading the magnetostriction characteristics.

SUMMARY OF THE INVENTION

The object of the invention is to provide a giant magnetostrictive material and a heat treatment method for the giant magnetostrictive material which can restore magnetostriction characteristics without fusion of rods caused by heat treatment.

In order to solve the problem, a giant magnetostrictive material according to the first aspect of the invention comprises an RTx alloy (R being at least one kind of rare-earth element, T being at least one kind of metal selected from a group of Fe, Ni and Co, $1.50 \leq x \leq 2.00$) including at least two phases, a main phase and an R-rich phase, characterized in that the average width of the R-rich phase is within the range of 0.01 to 1 μm.

This fuses the R-rich phase and reduces the area of microcrack generated on the RTx alloy without causing fusion of the RTx alloys processed in rod shape, thereby restoring the magnetostriction characteristics degraded during working of the RTx alloy.

A giant magnetostrictive material after heat treatment according to the second aspect of the invention comprises an RTx alloy (R being at least one kind of rare-earth element, T being at least one kind of metal selected from a group of Fe, Ni and Co, $1.50 \leq x \leq 2.00$) including at least two phases, a main phase and an R-rich phase, characterized in that the swelling of the R-rich phase is not located on the surface.

This removes the working distortion of the RTx alloys processed in rod shape without causing fusion of rods, thereby restoring the magnetostriction characteristics of the RTx alloy even when heat treatment is performed on a stack of a large number of RTx alloys processed in rod shape.

A heat treatment method for a giant magnetostrictive material according to the third aspect of the invention is characterized in that the method performs heat treatment on an R-rich phase of an RTx alloy (R being at least one kind of rare-earth element, T being at least one kind of metal selected from a group of Fe, Ni and Co, $1.50 \leq x \leq 2.00$) below an eutectic point as a temperature-constant boundary of a phase where both a solid phase and a liquid phase occur and a solid phase in a state diagram.

This fuses the R-rich phase alone without suppressing the R-rich phase from bleeding on the rod surface, thereby reducing the area of microcrack generated on the RTx alloy without causing fusion of the RTx alloys processed in rod shape.

This allows heat treatment on a stack of RTx alloys processed in rod shape, thus restoring the magnetostriction characteristics degraded during working of the RTx alloy while making heat treatment more efficient.

A heat treatment method for a giant magnetostrictive material according to the fourth aspect of the invention is characterized in that the method fuses at least part of an R-rich phase of an RTx alloy (R being at least one kind of rare-earth element, T being at least one kind of metal selected from a group of Fe, Ni and Co, $1.50 \leq x \leq 2.00$).

This fuses theR-rich phase of an RTx alloy at a temperature below an eutectic point, thereby removing the working distortion of the RTx alloys processed in rod shape without causing fusion of rods.

A heat treatment method for a giant magnetostrictive material according to the fifth aspect of the invention is characterized in that the R is at least one kind of rare-earth element selected from a group of Tb and Dy.

This obtains a giant magnetostrictive material which generates large magnetostriction even when external magnetic field strength is low.

A heat treatment method for a giant magnetostrictive material according to the sixth aspect of the invention is characterized in that Tb is within the range of 25 to 50 percentage by weight of the R.

This obtains a giant magnetostrictive material which has temperature characteristics that magnetostriction at ordinary temperatures is large.

A heat treatment method for a giant magnetostrictive material according to the seventh aspect of the invention is characterized in that the heat treatment temperature is within the range of 750 to 860° C.

A heat treatment method for a giant magnetostrictive material according to the eighth aspect of the invention is characterized in that the heat treatment temperature holding at the range of 750 to 860° C. is carried out and completed in from 30 minutes to 6 hours.

This fuses the R-rich phase alone around the main phase without suppressing the R-rich phase from bleeding on the surface of rods, thereby removing the working distortion of the RTx alloys processed in rod shape without causing fusion of rods.

DETAILED DESCRIPTION OF THE PREFERRED EMBODIMENTS

A giant magnetostrictive material and a heat treatment method for the giant magnetostrictive material according to an embodiment of the invention will be described referring to drawings.

End faces of a giant magnetostrictive material are polished during processing of the giant magnetostrictive material in rod shape. FIG. 1 is a conceptual drawing obtained when the polished surface is observed through a scanning electron microscope (SEM).

Figure 1A:
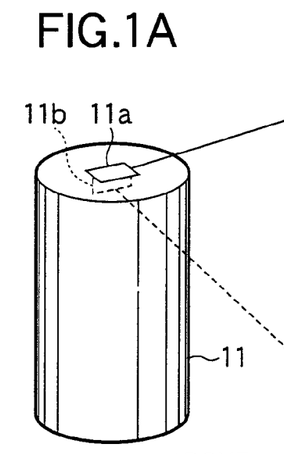
FIGS. 1A to 1G are conceptual drawings obtained when the polished surface of a giant magnetostrictive material processed in rode shape is observed through an SEM.
Figure 1B:
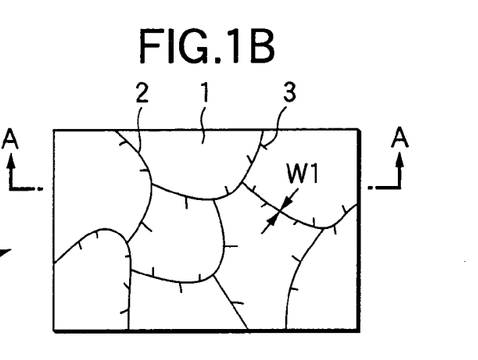
Figure 1C:
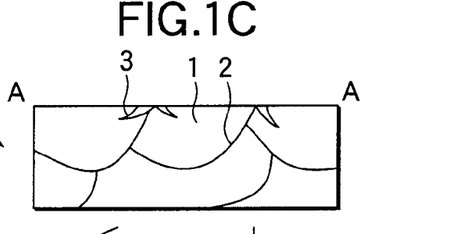
Figure 1D:
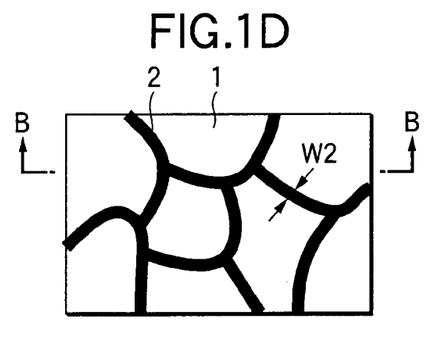
Figure 1E:
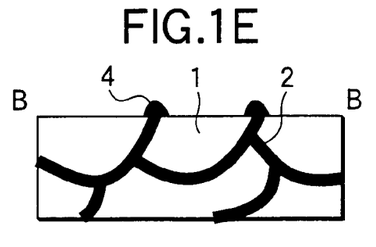
Figure 1F:
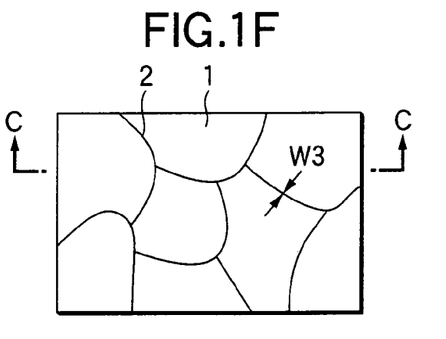
Figure 1G:
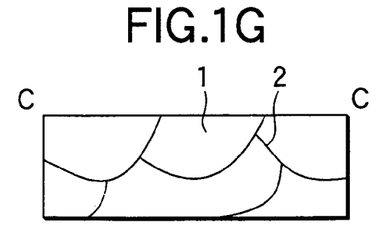

FIG. 1A shows a giant magnetostrictive material processes in rod shape. FIG. 1B is a plan view showing the structure of a surface 11a of a rod 11 assumed before heat treatment on a giant magnetostrictive material. FIG. 1C is a cross-sectional view showing the structure of a section 11b of the rod 11 taken on the section line A-A of FIG. 1B. FIG. 1D is a plan view showing the structure of the surface 11a of the rod 11 assumed after heat treatment on the giant magnetostrictive material at 950° C. FIG. 1E is a cross-sectional view showing the structure of a section 11b of the rod 11 taken on the section line B-B of FIG. 1D. FIG. 1F is a plan view showing the structure of the surface 11a of the rod 11 assumed after heat treatment on the giant magnetostrictive material at 820° C. FIG. 1G is a cross-sectional view showing the structure of a section 11b of the rod 11 taken on the section line C-C of FIG. 1F.

In FIG. 1A, it is assumed that a giant magnetostrictive material is processed in the shape of a rod 11 and the surface and section of the rod 11 is observed using a scanning electron microscope.

In this example, as shown in FIGS. 1A and 1B. the giant magnetostrictive material comprises an RTx alloy ($1.50 \leq x \leq 2.00$) including at least two phases, a crystal grain 1 being a main phase and a grain boundary 2 being an R-rich phase. The main phase is one whose main component is an RTx composition while the R-rich phase is one richer in an R component than the main phase.

In the case of an $RT_2$ alloy for example, the crystal grain 1 mainly comprises a composition of the $RT_2$ alloy and the grain boundary 2 a composition of an $R_{17}T_2$ alloy.

For a giant magnetostrictive material before heat treatment, it is observed that the width W1 of the grain boundary 2 comprising the R-rich phase is 20 to 30 A by using a transmission electron microscope which provides higher-power observation.

Here, R comprises at least one kind of rare-earth element which can be selected from a group of Tb, Sm, Dy, Ho, Er and Tm, for example.

T comprises at least one kind of metal which can be selected from a group of Fe, Ni, and Co, and may include transition metals such as Mn, Cr, Mo and W forming rare-earth elements and alloys.

By setting x to a range of $1.50 \leq x \leq 2.00$, it is possible to reduce occurrence of out-of-phase such as an $RT_3$ phase thus improving the magnetostriction.

For example, by using a composition of $(Tb, Dy)Fe_2$, as an RTx alloy, it is possible to obtain a giant magnetostrictive material with large magnetostriction in low external magnetic field strength. Setting Tb to a range of 20 to 50 percentage by weight of R, it is possible to obtain a giant magnetostrictive material having temperature characteristics that magnetostriction is large at ordinary temperatures.

Next, by using a composition of $Tb_{0.30}Dy_{0.70}Fe_{2.0}$ as an RTx alloy, it is possible to minimize crystal magnetic anisotropy at ordinary temperatures while securing large magnetostriction thus obtaining a good magnetic field response.

When working such as cutting and end face polishing is applied to this giant magnetostrictive material, the magnetostriction of the giant magnetostrictive material is worsened. It is assumed that this is because microcrack 3 is formed on the surface of the giant magnetostrictive material.

Thus, working distortion of the giant magnetostrictive material is removed by performing heat treatment at a temperature above the eutectic point of the R-rich phase Tp, e.g, 950° C. to restore the magnetostriction characteristics.

It is assumed that performing heat treatment at a temperature above the eutectic point of the R-rich phase Tp causes the R-rich phase to be fused and microcrack 3 to be recovered by way of liquid quality (fused phase) thereby restoring the magnetostriction characteristics.

Here, the eutectic point Tp is defined as a temperature-constant boundary of a phase where both a solid phase and a liquid phase occur and a solid phase. For example, in the state diagram of $RFe_2$ alloy in FIG. 2, the phase where both a solid phase and a liquid phase occur means a phase comprising $RFe_2$+LIQ. or a phase comprising LIQ.+($\alpha$–R) while the solid phase means a phase comprising $RFe_2$+($\alpha$–R)

Performing heat treatment at a temperature above the eutectic point of the R-rich phase Tp causes the width W2 of the grain boundary 2 comprising the R-rich phase to be 1 to 10 µm, as shown in FIGS. 1D and 1E. In this practice, it is observed that the R-rich phase bleeds on the rod surface and the swelling 4 of the R-rich phase is formed on the rod surface.

Thus, Performing heat treatment on a stack of giant magnetostrictive materials processed in rod shape causes fusion of rods, and separating the rods from each other exerts distortion on the giant magnetostrictive material, which degrades the magnetostriction characteristics of the giant magnetostrictive material again.

Figure 2:
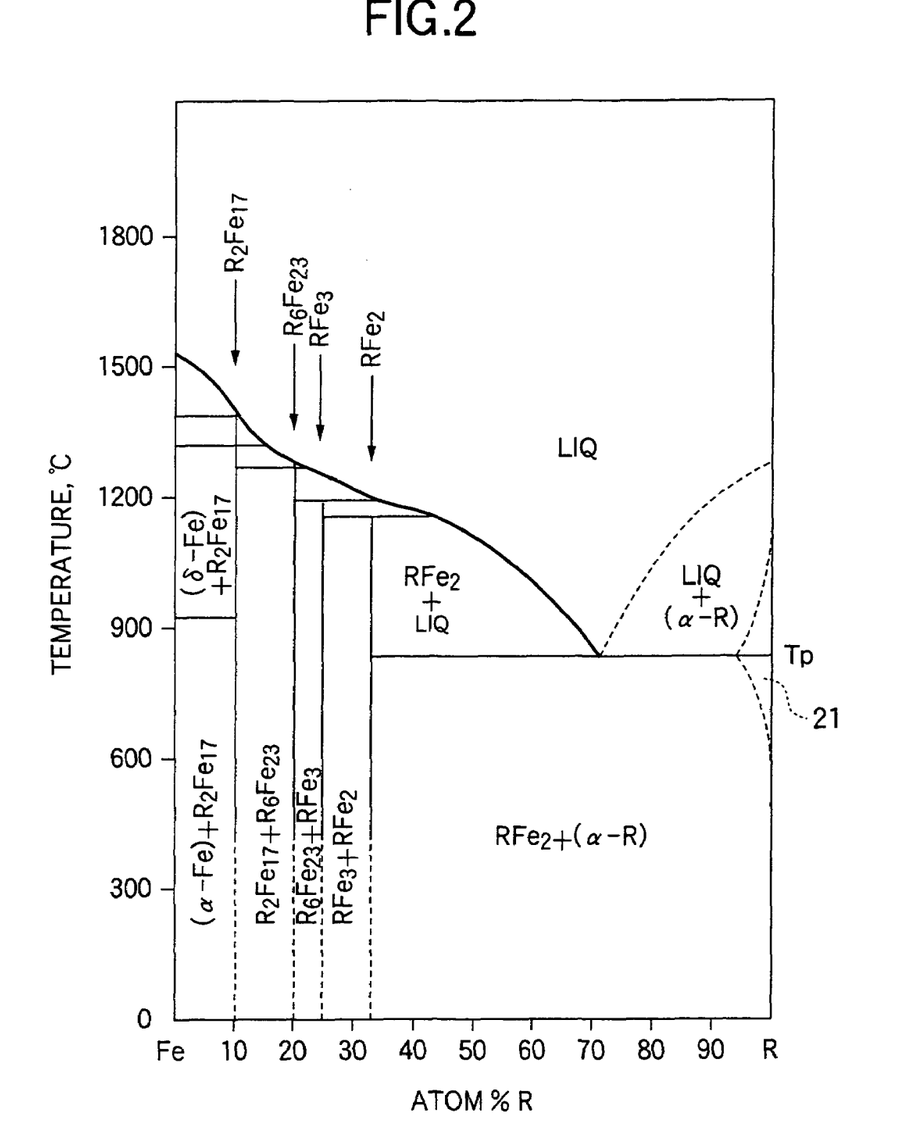
FIG. 2 is a state diagram explaining an example of an eutectic point according to an embodiment of the invention.

Here, in the R-rich phase, R is not 100 percent but a trace of T (Fe for an $RF_2$ alloy) is inevitably contained. Thus, it is expected that a fused phase 21 represented in dotted lines will be present below the eutectic point Tp also, as shown in FIG. 2.

It is thus possible to fuse the R-rich phase alone by performing heat treatment at a temperature below the eutectic point of the R-rich phase, e.g., 820° C., as in this patent application.

Thus, it is possible to release a stress via the fused phase even when heat treatment is performed below the eutectic point Tp via the fused phase 21 thereby restoring the magnetostriction characteristics degraded during working of an RTx alloy. It is assumed that this is because liquid quality is used to recover microcrack 3 to reduce the area of the microcrack 3.

Here, by fusing the R-rich phase at a temperature below the eutectic point, it is possible to reduce the width W3 of the grain boundary 2 comprising the R-rich phase to 0.01 to 1 µm, as well as suppress bleeding of the R-rich phase on the rod surface, thus reducing the swelling 4 of the R-rich phase, as shown inn FIGS. 1F and 1G.

This prevents fusion of rods of giant magnetostrictive materials even in case heat treatment is performed on a stack of giant magnetostrictive materials processed in rod shape and eliminates the need to separate the rods of giant magnetostrictive materials, thus preventing degrading of magnetostriction characteristics of the giant magnetostrictive material.

Next, preparation of a sample will be described.

Figure 3:
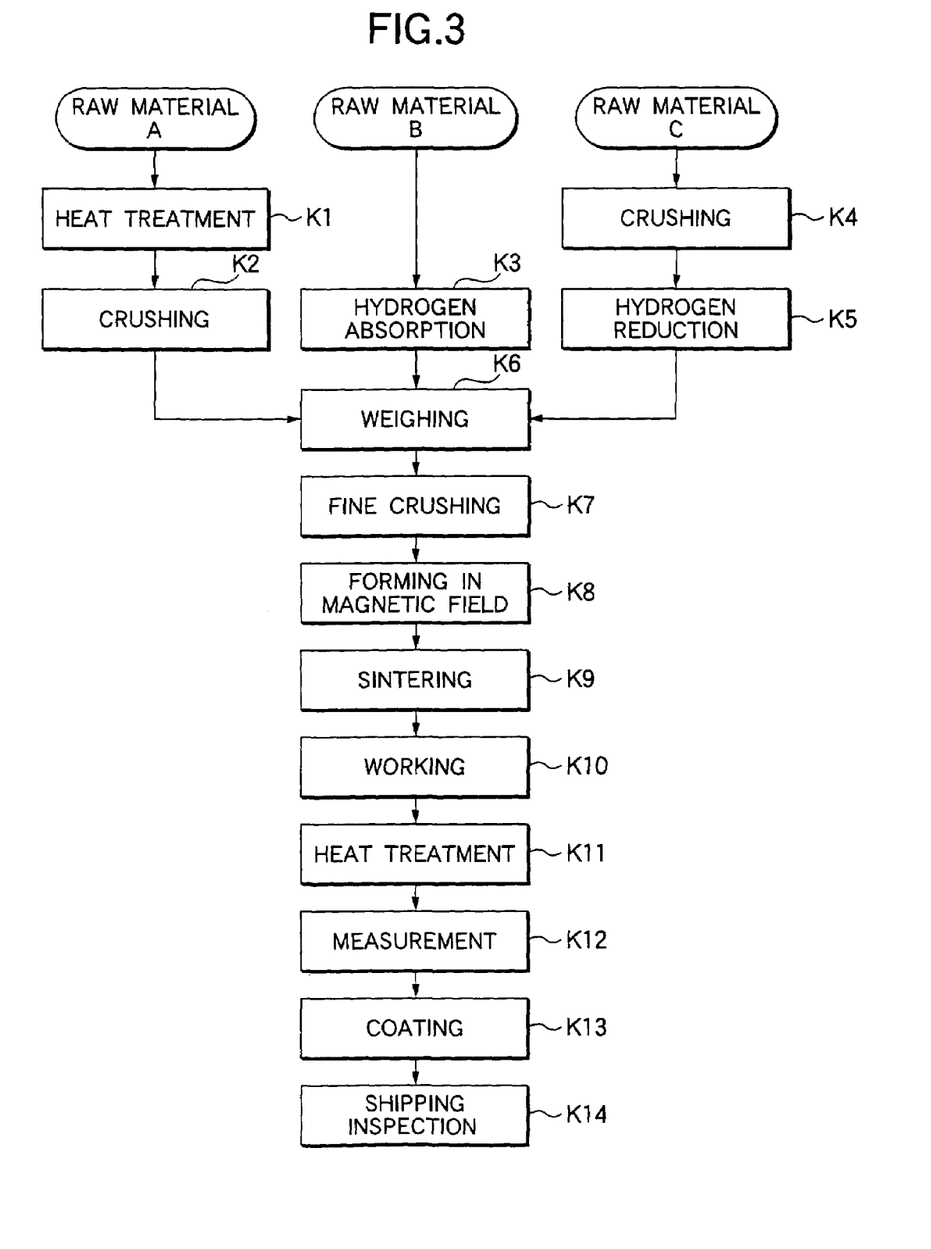
FIG. 3 is a process diagram showing the manufacturing process of a giant magnetostrictive material according to an embodiment of the invention.

FIG. 3 is a block diagram showing the manufacturing process of a giant magnetostrictive material according to an embodiment of the invention.

In FIG. 3, as a raw material A, for example a $Tb_{0.4}Dy_{0.6}Fe_{1.93}$ alloy is prepared by respectively weighing and mixing each other Tb, Dy and Fe then fusing them in an Ar atmosphere.

Next, the $Tb_{0.4}Dy_{0.6}Fe_{1.93}$ alloy is annealed at a temperature of 1220° C. for 15 hours in an Ar atmosphere (K1), and crushed until the average grain diameter becomes less than 1500 µm (K2).

Meanwhile, as a raw material B in FIG. 3, a $Dy_tFe_{(1-t)}$ alloy is prepared by weighing and fusing Dy and Fe in an Ar atmosphere.

Next, hydrogen absorption is performed by retaining the $Dy_tFe_{(1-t)}$ alloy at a temperature of 150° C. for 30 minutes in a hydrogen gas atmosphere (K3).

By performing hydrogen absorption of the $Dy_tFe_{(1-t)}$ alloy, it is possible to suppress oxidation of the $Dy_tFe_{(1-t)}$ alloy while crushing the $Dy_tFe_{(1-t)}$ alloy. This improves the density of a sintered body and increases the magnetostriction.

Further, as a raw material C in FIG. 3, Fe powder is used. Reduction is performed by crushing this iron powder (K4) and retaining the resulting powder at a high temperature in a hydrogen gas atmosphere (K5).

Next, these raw materials A, B, C are weighed at a ratio of 82:12:6 (K6), then these raw materials are mixed with each other and finely crushed until the average grain diameter reaches 5 to 15 µm (K7).

Next, a magnetic field is applied to the finely crushed mixture to form a rod shape for example (K8).

Here, by using a $Tb_{0.4}Dy_{0.6}Fe_{1.93}$ alloy as a raw material A, it is possible to increase the magnetic anisotropy to easily align an axis of easy magnetization with a [111] axis with large magnetostriction, thus preparing a giant magnetostrictive material with large magnetostriction by way of low magnetic field strength formation.

Next, the formed mixture is sintered in a hydrogen gas atmosphere to prepare a giant magnetostrictive material comprising a composition of $Tb_{0.30}Dy_{0.70}Fe_{1.885}$ (K9).

Here, by sintering a formed body where a raw material A is mixed with raw materials B, C, it is possible to mitigate a large crystal magnetic anisotropy.

This reduces the crystal magnetic anisotropy while aligning the [111] axis with large magnetostriction, thus securing large magnetostriction and obtaining a good magnetic field response at ordinary temperatures.

Next, working is performed on this giant magnetostrictive material in rod shape, such as cutting/end polishing and barrel polishing/etching (K10), then heat treatment is performed to remove working distortion of the giant magnetostrictive material.

The heat treatment temperature for the giant magnetostrictive material is preferably below 860° C. as the eutectic point of $Tb_{0.30}Dy_{0.70}Fe_{1.885}$, and in particular within the range of 750 to 820° C. The heat treatment holding time for the giant magnetostrictive material is selected from the range of 30 minutes to 6 hours.

This suppresses the R-rich phase from bleeding on the surface of rods even when the R-rich phase of a $Tb_{0.30}Dy_{0.70}Fe_{1.885}$ alloy is fused.

Thus, fusion of rods can be prevented even in case heat treatment is performed on a stack of a large number of rods, thus making heat treatment more efficient while suppressing degradation of magnetostriction characteristics.

Taking a (Tb, Dy)Fe alloy as an example, the eutectic point in FIG. 2 gradually rises with an increase in Tb/Tb+Dy. Thus, the heat treatment temperature for a giant magnetostrictive material is preferably elevated in accordance with the increase in Tb/Tb+Dy.

Figure 4:
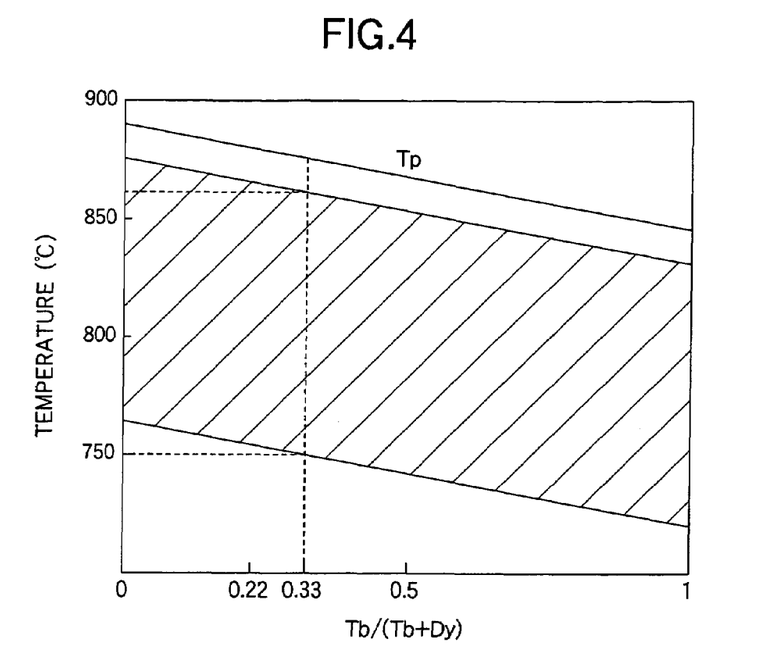
FIG. 4 shows a relationship between Tb/R and the heat treatment temperature of a giant magnetostrictive material according to an embodiment of the invention.
Figure 8:
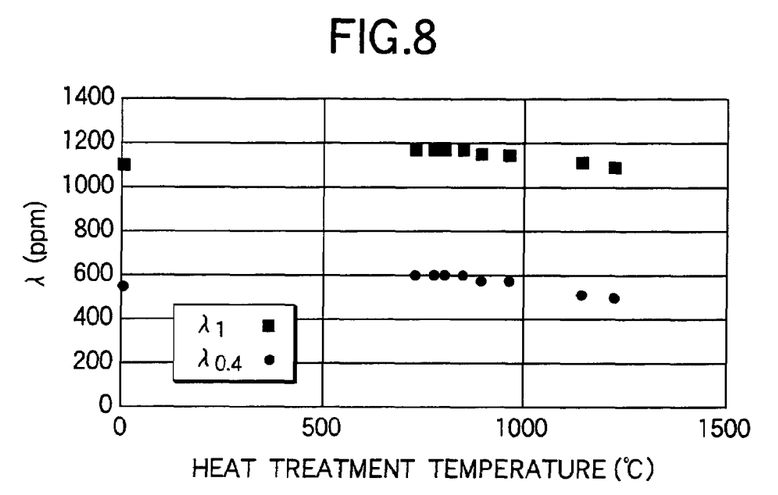
FIG. 8 shows a relationship between the aging temperature and the magnetostriction characteristics of a giant magnetostrictive material according to an embodiment of the invention.

That is, as shown in FIG. 8, the heat treatment temperature is preferably set within the range shown by hatch lines in FIG. 4, in accordance with Tb/Tb+Dy of the (Tb, Dy)Fe alloy.

Next, in FIG. 3, characteristics of the giant magnetostrictive material are measured (K12), rust-proof coating is applied (K13), and shipping inspection is performed (K14).

The embodiment of the invention will be detailed.

As a raw material A in FIG. 3, A $Tb_{0.4}Dy_{0.6}Fe_{1.93}$ alloy was prepared by respectively weighing and mixing each other Tb, Dy and Fe then fusing them in an Ar atmosphere.

Next, the $Tb_{0.4}Dy_{0.6}Fe_{1.93}$ alloy was annealed at a temperature of 1220° C. for 15 hours in an Ar atmosphere, coarsely crushed using a jaw crusher until the average grain diameter became about 5 mm, then coarsely crushed until the average grain diameter became 100 to 1500 µm.

Meanwhile, as a raw material B in FIG. 3, a $Dy_2Fe$ alloy was prepared by weighing and fusing Dy and Fe in an Ar atmosphere.

Next, hydrogen absorption was performed by retaining the $Dy_2Fe$ alloy at a temperature of 150° C. for 30 minutes in a hydrogen gas atmosphere.

Further, as a raw material C in FIG. 3, Fe powder in an average diameter of about 5 μm was used. Reduction was performed by retaining the iron powder at a temperature of 200° C. for about 30 minutes in a hydrogen gas atmosphere.

Next, these raw materials A, B, C were weighed at a ratio of 82:12:6, then these raw materials were finely crushed until the average grain diameter reached 5 to 15 μm in an $N_2$ atmosphere by using an atomizer 2 (produced by Tokyo Atomizer Manufacturing Corporation).

Then, the finely crushed mixture was formed under a pressure of $59 \times 10^7$ Pa to attain a shape of ɸ 3.5 in a magnetic field of $80 \times 10^4$ (A/m) Pa parallel in longitudinal direction.

Next, the formed mixture was sintered at a temperature of 1235° C. in a hydrogen gas atmosphere to prepare a giant magnetostrictive material comprising a composition of $Tb_{0.30}Dy_{0.70}Fe_{1.885}$.

Then, cutting/end polishing and barrel polishing/etching were performed on the sintered body to prepare a rod of ɸ 3.5, then heat treatment was performed for one hour to remove working distortion of the rod.

Ten rods were arranged in intimate contact with each other in heat treatment on the rods and a heat treatment temperature was varied within the range of 700 to 1230° C. to check a change in characteristics of these rods. At this time, holding time was one hour. The magnetostriction measured under axial compression of 60 kg/cm².

As a change in characteristics of a giant magnetostrictive material, density of a sintered body Dt (%), magnetostriction $\lambda_{0.4}$ (ppm) obtained when a magnetic field strength of 400 oersted was applied, a variation $\lambda_{0.4} \cdot \sigma$ (ppm) in the magnetostriction $\lambda_{0.4}$ obtained when a magnetic field strength of 400 oersted was applied, magnetostriction $\lambda_1$ (ppm) obtained when a magnetic field strength of 1000 oersted was applied, and a variation $\lambda_1 \cdot \sigma$ (ppm) in the magnetostriction $\lambda_1$ and a fusion ratio (%) obtained when a magnetic field strength of 1000 oersted was applied were checked. The fusion ratio was defined as a percentage to represent the number of fused rods out of ten.

Figure 5:
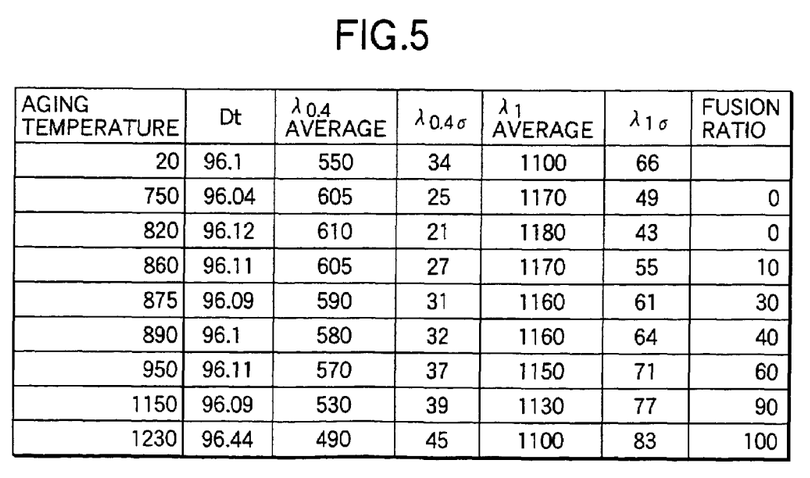
FIG. 5 shows a change in the characteristics under heat treatment on a giant magnetostrictive material according to an embodiment of the invention.
Figure 6:
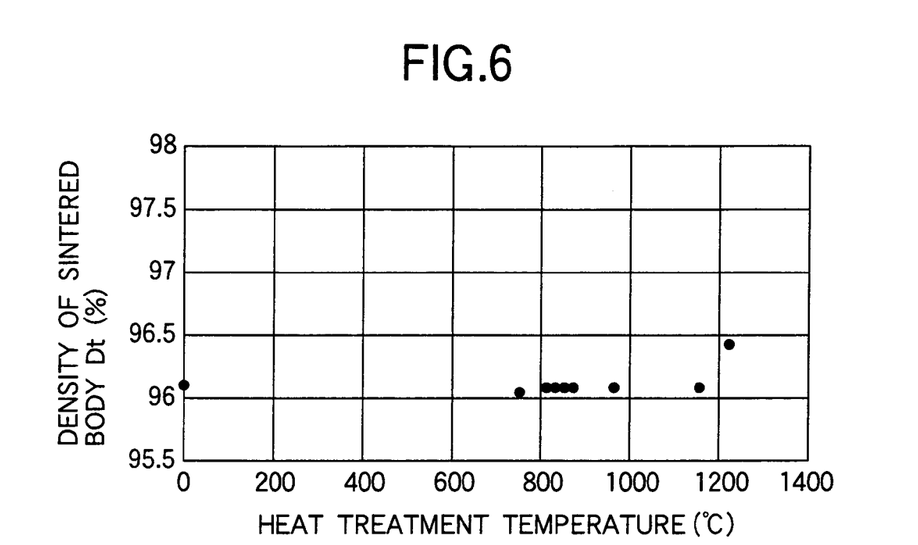
FIG. 6 shows a relationship between the aging temperature and the sintering density of a giant magnetostrictive material according to an embodiment of the invention.

FIG. 5 shows a change in characteristics during heat treatment on a giant magnetostrictive material according to an embodiment of the invention. FIG. 6 shows a relationship between the heat treatment temperature and the sintering density, FIG. 7 a relationship between the aging temperature in FIG. 5 and the core fusion ratio, FIG. 8 a relationship between the heat treatment temperature in FIG. 5 and the magnetostriction characteristics, and FIG. 9 a relationship between the magnetostriction characteristics in FIG. 5 and the core fusion ratio, respectively.

In FIGS. 5 and 6, the density of the sintered body of a giant magnetostrictive material showed a negligible change when heat treatment was performed below a eutectic point, compared with when heat treatment was performed above the eutectic point.

Figure 7:
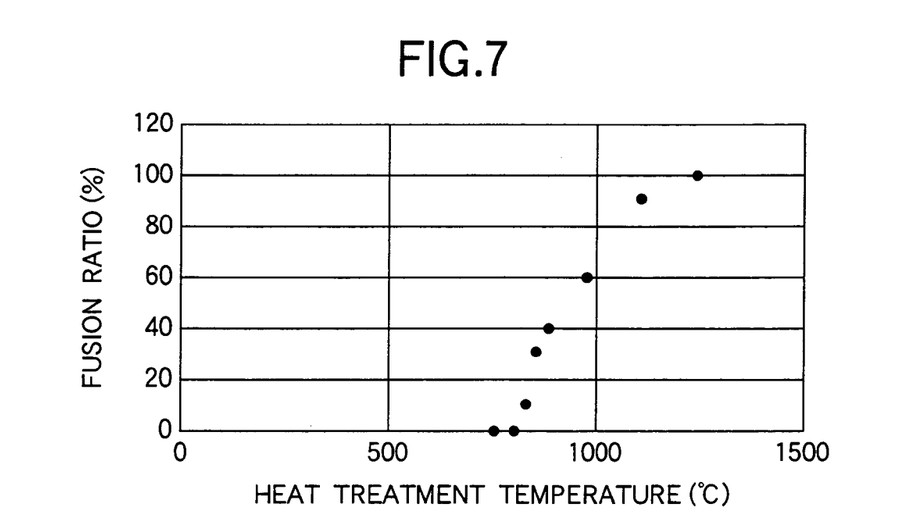
FIG. 7 shows a relationship between the aging temperature and the core fusion ratio of a giant magnetostrictive material according to an embodiment of the invention.

In FIGS. 5 and 7, in case heat treatment was performed at a temperature of 820° C., fusion of a giant magnetostrictive material did not take place but the fusion ratio of the giant magnetostrictive material rose as the temperature rose from 820° C., reaching 100 percent at temperature of 1230° C.

In FIGS. 5 and 8, the magnetostriction λ of a giant magnetostrictive material was restored by performing heat treatment at a temperature above 750° C. When the temperature exceeded 820° C., the magnetostriction λ of the giant magnetostrictive material gradually dropped and under heat treatment at a temperature of 1230° C., the magnetostriction λ dropped below that obtained before heat treatment.

It is assumed that, the magnetostriction λ of a giant magnetostrictive material gradually drops above a temperature of 820° C. because fusion of a giant magnetostrictive material takes place at a temperature above 820° C. and new distortion is applied to the giant magnetostrictive material when fused rods are separated from each other.

Figure 9:
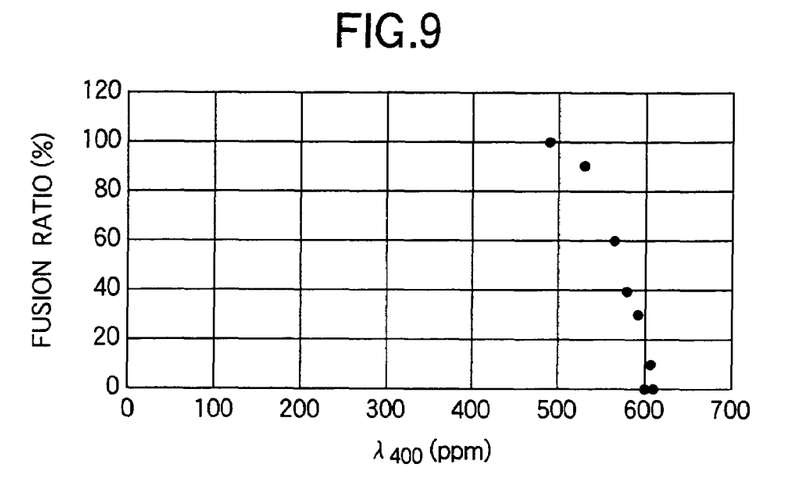
FIG. 9 shows a relationship between the magnetostriction characteristics and the core fusion ratio of a giant magnetostrictive material according to an embodiment of the invention.

As shown in FIGS. 5 and 9, the magnetostriction of a giant magnetostrictive material gradually drops in accordance with an increase in the fusion ratio of the giant magnetostrictive material.

Thus, for heat treatment on a giant magnetostrictive material, a temperature range is preferably set at a temperature more than 750° C. where the restoration effects of the magnetostriction λ is greater and less than 820° C. where fusion of the giant magnetostrictive material does not take place.

Figure 10A:
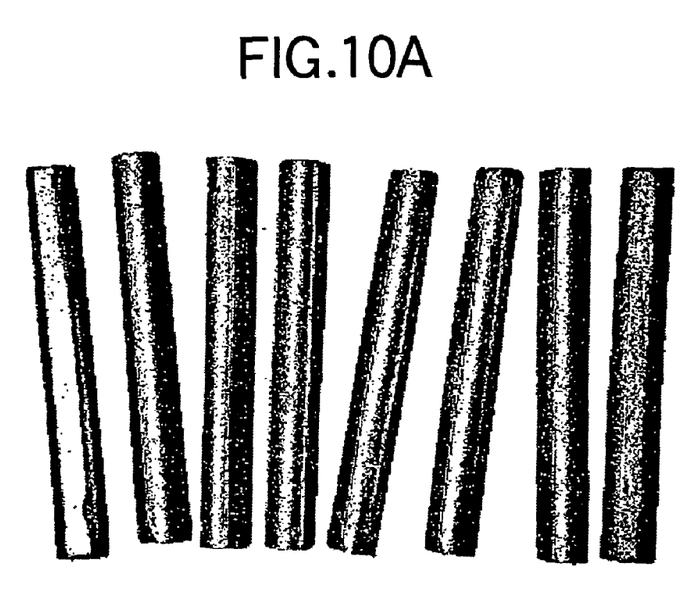
FIGS. 10A and 10B show the rod fusion state assumed after heat treatment on a giant magnetostrictive material according to an embodiment of the invention.
Figure 10B:
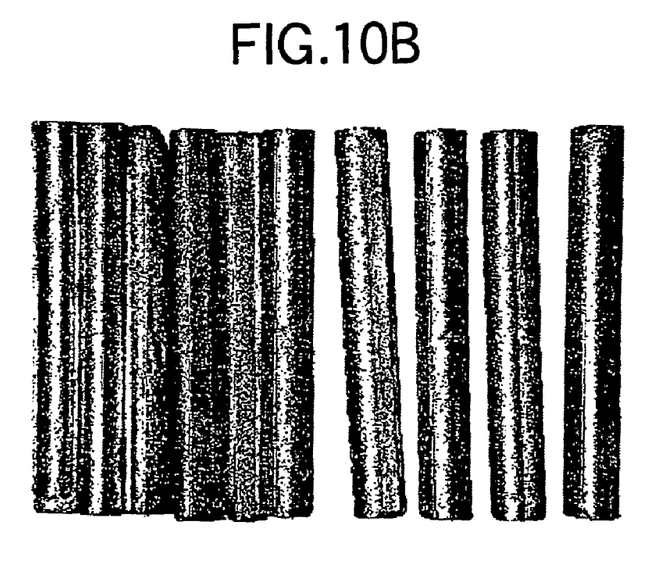

FIG. 10 shows the rod fusion state assumed after heat treatment on a giant magnetostrictive material according to an embodiment of the invention. FIG. 10A shows a case where heat treatment is performed at an aging temperature of 820° C., and FIG. 10B at an aging temperature of 950° C.

In FIG. 10, fusion of rods was is not observed under heat treatment at an aging temperature of 820° C. while it is observed under heat treatment at an aging temperature of 950° C.

Thus, by performing heat treatment on a giant magnetostrictive material at a temperature below the eutectic point, it is possible to prevent fusion of rods and efficiently recover the magnetostriction of a giant magnetostrictive material.

Figure 11A:
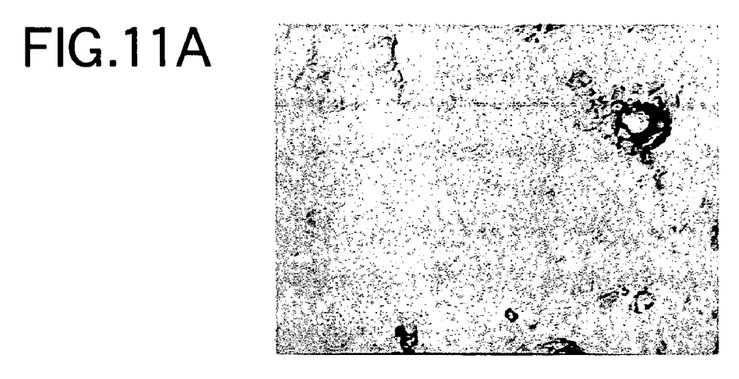
FIGS. 11A to 11C shows photographs of the state of a grain boundary assumed after heat treatment according to an embodiment of the invention.
Figure 11B:
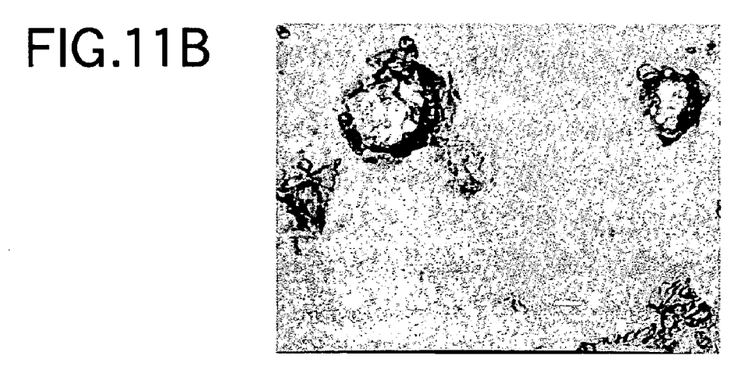
Figure 11C:
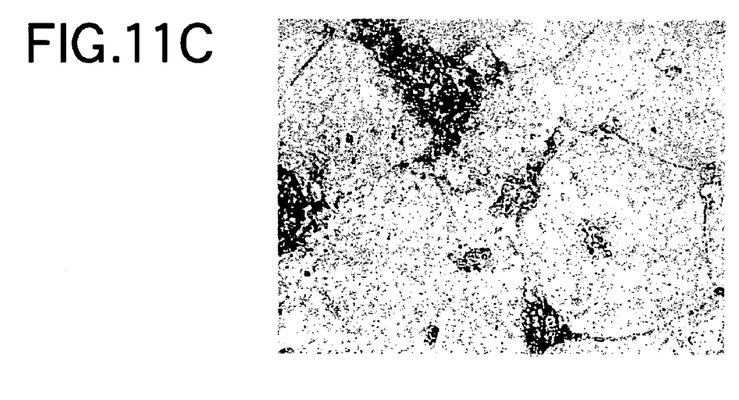

FIG. 11 shows a photograph of the state of a grain boundary assumed after heat treatment on a giant magnetostrictive material according to an embodiment of the invention as observed through a scanning electron microscope.

FIG. 11A shows the surface state of a giant magnetostrictive material assumed before heat treatment, FIG. 11B the surface state of a giant magnetostrictive material assumed under heat treatment at an aging temperature of 750° C., and FIG. 11C the surface state of a giant magnetostrictive material assumed under heat treatment at an aging temperature of 965° C.

In FIG. 11A, the grain boundary width of a giant magnetostrictive material is as thin as 20 to 30 nm when observed through a transmission electron microscope (TEM) while the grain boundary of the giant magnetostrictive material was not observed with the power of a scanning electron microscope (SEM).

In FIG. 11B, the grain boundary width of a giant magnetostrictive material under heat treatment at an aging temperature of 750° C. is as thin as 0.1 to 1 μm when observed through a TEM while the grain boundary of the giant magnetostrictive material was not observed with the power of an SEM.

In FIG. 11C, the grain boundary width of a giant magnetostrictive material under heat treatment at an aging temperature of 965° C. is as 1 to 10 μm, which is large enough to be observed with the power of an SEM.

Thus, by performing heat treatment at a temperature below the eutectic point, it is possible to suppress an increase in the grain boundary width of a giant magnetostrictive material thereby suppressing bleeding of an R-rich phase on a rod surface and fusion of rods of the giant magnetostrictive material.

While a method for preparing a giant magnetostrictive material by way of a powder sintering approach, heat treatment according to the invention is not limited to a giant magnetostrictive material prepared by way of powder sintering but may be applied to a giant magnetostrictive material prepared through a single crystal growing method such as the Bridgman method and the zone melting method.

As mentioned earlier, according to the invention, it is possible remove the working distortion of an RTx alloy while preventing fusion of rods by performing heat treatment at a temperature below a eutectic point, thereby restoring the magnetostriction characteristics of an RTx alloy.

What is claimed is:

1. A giant magnetostrictive material consisting of a heat treated alloy according to formula $RT_x$ comprising at least one crystal grain main phase and at least one grain boundary R-rich phase, wherein the at least one grain boundary R-rich phase has an average width within the range of from 0.01 μm to 1 μm; R is one or more rare-earth elements; T is one or more metals selected from the group consisting of iron (Fe), nickel (Ni), cobalt (Co), and optionally one or more transition metals; and $1.50 \leq x \leq 2.00$, and wherein the heat treated $RT_x$ alloy is produced by a process comprising heat treating the $RT_x$ alloy at a temperature within the range of from 750° C. to 860° C., which is a temperature below the eutectic point of the grain boundary R-rich phase, whereby the average width of the grain boundary R-rich phase is maintained within the range of from 0.01 μm to 1 μm and bleeding of the grain boundary R-rich phase onto a surface of the giant magnetostrictive material is suppressed.

2. The giant magnetostrictive material according to claim 1, wherein R is one or more rare-earth elements selected from the group consisting of terbium (Tb), samarium (Sm), dysprosium (Dy), holmium (Ho), erbium (Er) and thulium (Tm).

3. The giant magnetostrictive material according to claim 1, wherein R comprises terbium (Tb) in an amount of from 20 wt. % to 50 wt. %.

4. The giant magnetostrictive material according to claim 1, wherein the optional one or more transition metals of T are selected from the group consisting of manganese (Mn), chromium (Cr), molybdenum (Mo) and tungsten (W).

5. The giant magnetostrictive material according to claim 1, wherein the heat treated alloy is represented by the formula $Tb_{0.30}Dy_{0.70}Fe_{1.885}$.

6. The giant magnetostrictive material according to claim 1, wherein the heat treated $RT_x$ alloy is produced by a process comprising heat treating the $RT_x$ alloy at a temperature within the range of from 750° C. to 820° C.

7. The giant magnetostrictive material according to claim 1, wherein the heat treating of the $RT_x$ alloy is conducted for a period of from 30 minutes to 6 hours.

8. The giant magnetostrictive material according to claim 1, wherein the giant magnetostrictive material is formed in the shape of one or more rods.

9. The giant magnetostrictive material according to claim 8, wherein fusion of the rods during the heat treating is suppressed.

10. A heat treatment method for producing the giant magnetostrictive material of claim 1, comprising heat treating an $RT_x$ alloy of the giant magnetostrictive material at a temperature within the range of from 750° C. to 860° C., which is a temperature below the eutectic point of a grain boundary R-rich phase of the $RT_x$ alloy, whereby the average width of the grain boundary R-rich phase is maintained within a range of from 0.01 μm to 1 μm and bleeding of the grain boundary R-rich phase onto a surface of the giant magnetostrictive material is suppressed, and wherein R is one or more rare-earth elements present within the grain boundary R-rich phase of the $RT_x$ alloy; T is one or more metals present within a crystal grain main phase of the $RT_x$ alloy and is selected from the group consisting of iron (Fe), nickel (Ni), cobalt (Co), and optionally one or more transition metals; and $1.50 \leq x \leq 2.00$.

11. The heat treatment method according to claim 10, wherein R is one or more rare-earth elements selected from the group consisting of terbium (Tb), samarium (Sm), dysprosium (Dy), holmium (Ho), erbium (Er) and thulium (Tm).

12. The heat treatment method according to claim 10, wherein R comprises terbium (Tb) in an amount of from 20 wt. % to 50 wt. %.

13. The heat treatment method according to claim 10, wherein the optional one or more transition metals of T are selected from the group consisting of manganese (Mn), chromium (Cr), molybdenum (Mo) and tungsten (W).

14. The heat treatment method according to claim 10, wherein the heat treated alloy is represented by the formula $Tb_{0.30}Dy_{0.70}Fe_{1.885}$.

15. The heat treatment method according to claim 10, wherein the heat treating of the $RT_x$ alloy is carried out at a temperature within the range of from 750° C. to 820° C.

16. The heat treatment method according to claim 10, wherein the heat treating of the $RT_x$ alloy is conducted for a period of from 30 minutes to 6 hours.

17. The heat treatment method according to claim 10, wherein the giant magnetostrictive material is formed in the shape of one or more rods.

18. The heat treatment method according to claim 17, wherein fusion of the rods during the heat treating is suppressed.

* * * * *